United States Patent
Hennus et al.

(10) Patent No.: US 7,791,709 B2
(45) Date of Patent: Sep. 7, 2010

(54) SUBSTRATE SUPPORT AND LITHOGRAPHIC PROCESS

(75) Inventors: Pieter Renaat Maria Hennus, Peer (BE); Frits Van Der Meulen, Eindhoven (NL); Joost Jeroen Ottens, Veldhoven (NL); Peter Paul Steijaert, Eindhoven (NL); Hubert Matthieu Richard Steijns, Veldhoven (NL); Peter Smits, Baarlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/000,100

(22) Filed: Dec. 7, 2007

(65) Prior Publication Data

US 2008/0158526 A1 Jul. 3, 2008

Related U.S. Application Data

(63) Continuation-in-part of application No. 11/635,789, filed on Dec. 8, 2006.

(51) Int. Cl.
*G03B 27/58* (2006.01)
*G03B 27/42* (2006.01)
*G03B 27/52* (2006.01)

(52) U.S. Cl. ............... 355/72; 355/53; 355/30
(58) Field of Classification Search .......... 355/72, 355/30, 53; 250/548
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,405,701 A | 9/1983 | Banks et al. | 430/5 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,864,386 A | 1/1999 | Nei | |
| 5,900,354 A | 5/1999 | Batchelder | 430/395 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B Kim
(74) *Attorney, Agent, or Firm*—Sterne, Kessler, Goldstein & Fox P.L.L.C.

(57) ABSTRACT

A substrate support constructed to support a substrate for immersion lithographic processing is disclosed. The substrate support has a central part and a peripheral part positioned around the central part. The substrate support further includes a thermal decoupler arranged to decrease heat transport between the central part and the peripheral part.

18 Claims, 5 Drawing Sheets

U.S. PATENT DOCUMENTS

| | | | |
|---|---|---|---|
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2006/0033892 A1* | 2/2006 | Cadee et al. | 355/30 |
| 2006/0207725 A1* | 9/2006 | Oohashi et al. | 156/345.53 |
| 2008/0137055 A1 | 6/2008 | Hennus et al. | |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 429 188 A2 | 6/2004 |
| EP | 1 429 188 A3 | 10/2004 |
| EP | 1 628 161 A2 | 2/2006 |
| EP | 1 628 161 A3 | 6/2006 |
| EP | 1 713 115 A1 | 10/2006 |
| EP | 1 804 122 A2 | 7/2007 |
| EP | 1 669 807 B1 | 8/2007 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

European Search Report for Appln. No. EP 07 12 2601 mailed Apr. 21, 2008, 3 pgs.

Non-Final Rejection mailed Apr. 3, 2009 for U.S. Appl. No. 11/635,789, filed Dec. 8, 2006, 8 pgs.

* cited by examiner

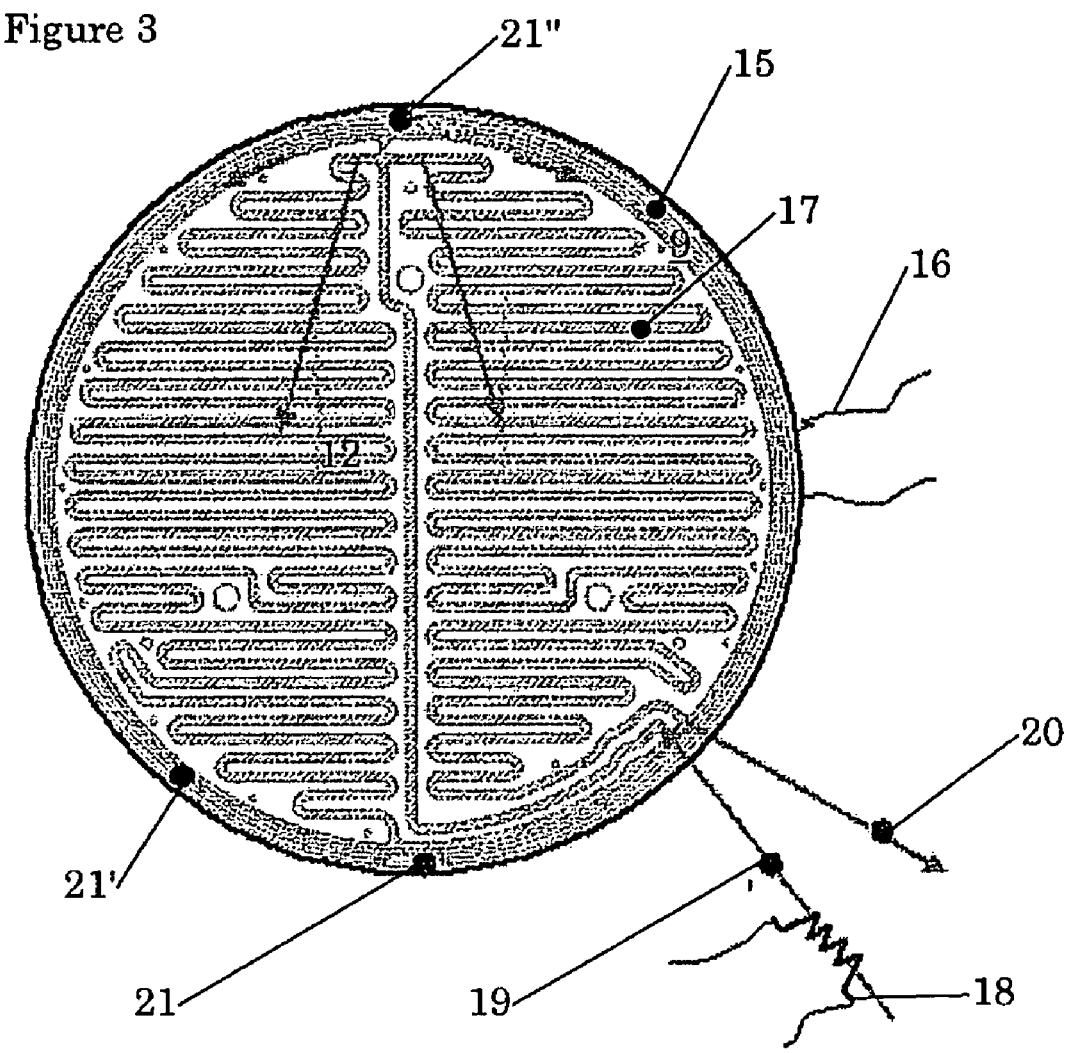

SUBSTRATE SUPPORT AND LITHOGRAPHIC PROCESS

RELATED APPLICATIONS

This is a continuation-in-part application of U.S. patent application Ser. No. 11/635,789, filed Dec. 8, 2006, the entire contents of that application hereby incorporated by reference.

FIELD

The present invention relates to a substrate support for supporting a substrate during immersion lithographic processing and to a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is an increased need for control of the substrate temperature, due to ever more demanding requirements for image resolution, in particular in the new field of immersion lithography. The substrate is supported by a substrate support and the immersion liquid may be removed via a peripheral part of the substrate support. During the removal of the immersion liquid a part of the liquid may vaporize inducing a heat load to the peripheral part of the substrate support leading to a temperature gradient of the substrate.

SUMMARY

It is desirable, for example, to provide a substrate support where an improved thermal stabilization of the substrate is provided near an edge of the substrate.

According to an aspect of the invention, there is provided a substrate support to support a substrate during immersion lithographic processing, the substrate support comprising:
   a central part;
   a peripheral part positioned around the central part; and
   a thermal decoupler arranged to decrease heat transport between the central part and the peripheral part.

According to an aspect of the invention, there is provided a lithographic process, comprising:
   predicting a heat load to be experienced by a substrate support configured to support a substrate, during a later step of the lithographic process;
   supplying a fluid to the substrate support;
   ducting the fluid through a duct of the substrate support;
   estimating a temperature change to the fluid between supplying the fluid to the substrate support and the fluid being ducted along a control position in the duct, based on the predicted heat load to the substrate support;
   during the later step, arranging the fluid to have a desired temperature at the control position by giving the fluid an offset to the desired temperature before supplying it to the substrate support, the offset corresponding to the estimated temperature change.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts a portion of substrate table, in plan, according to an embodiment;

DETAILED DESCRIPTION

Figure 1:
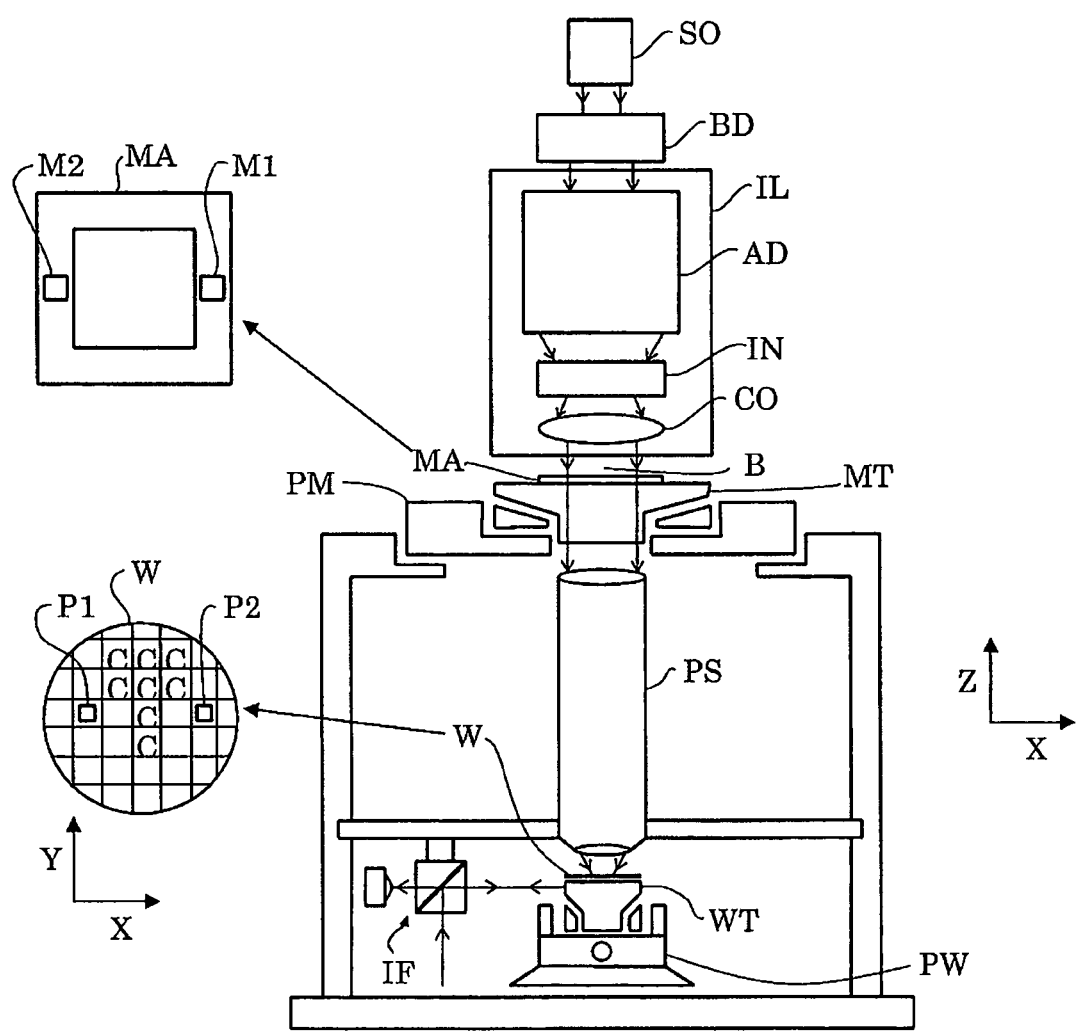
FIG. 1 depicts a lithographic apparatus according to an embodiment of the invention.

FIG. 1 schematically depicts a lithographic apparatus according to one embodiment of the invention. The apparatus comprises:
   an illumination system (illuminator) IL configured to condition a radiation beam B (e.g. UV radiation);
   a support structure (e.g. a mask table) MT constructed to support a patterning device (e.g. a mask) MA and connected to a first positioner PM configured to accurately position the patterning device in accordance with certain parameters;
   a substrate table (e.g. a wafer table) WT constructed to hold a substrate (e.g. a resist-coated wafer) W and connected to a second positioner PW configured to accurately position the substrate in accordance with certain parameters; and
   a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion fluid (e.g., an immersion liquid) or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines, the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
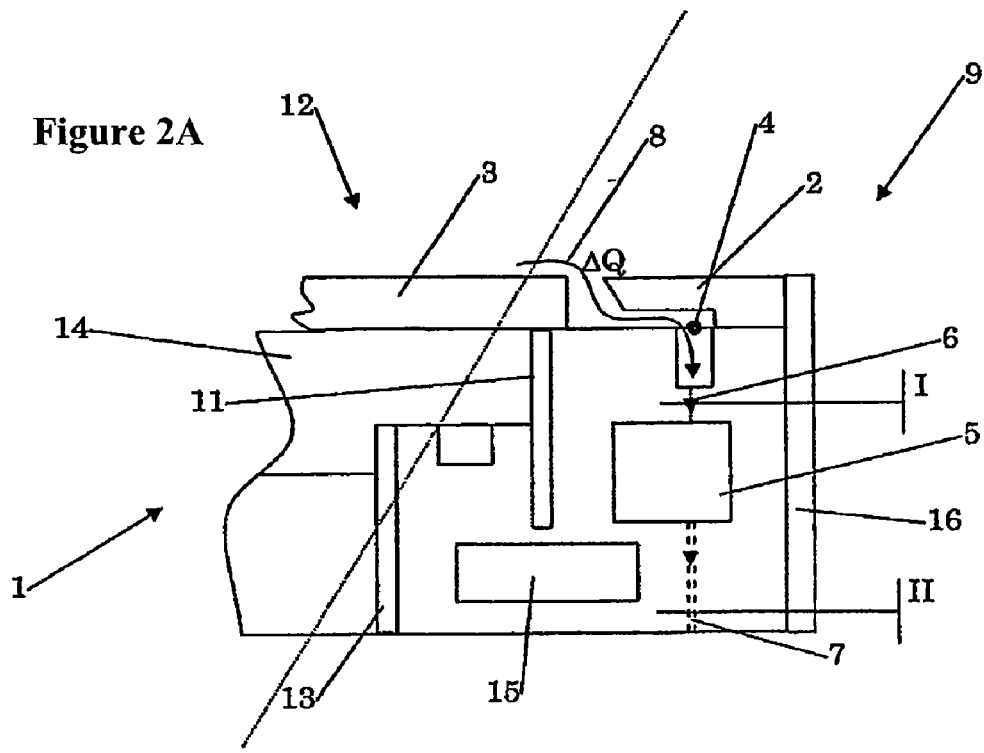
FIG. 2A depicts a portion of a substrate table according to an embodiment.
Figure 2B:
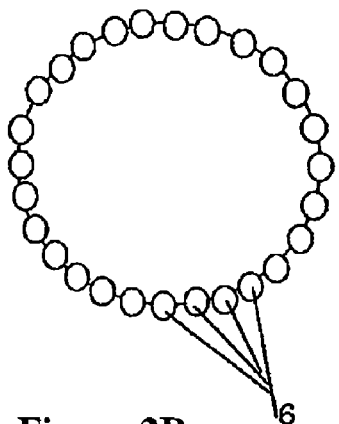
FIG. 2B shows a schematic cross-section of the substrate table in FIG. 2A along the lines I.
Figure 2C:
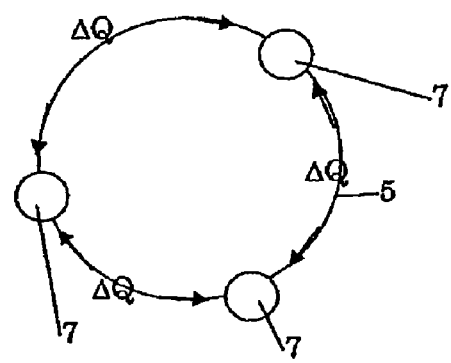
FIG. 2C shows a schematic cross-section of the substrate table in FIG. 2A along the lines II.

In an embodiment (FIG. 2A) of the invention, a substrate support (e.g., a substrate table) is constructed to support a substrate for immersion lithographic processing purposes. FIG. 2A shows a peripheral part of the substrate table 1 attached to a partly shown central part, according to the embodiment of the invention. In addition, schematically, cross-sectional views over the entire periphery of the substrate table 1 along the lines I and II are shown in FIG. 2B and FIG. 2C. A piece 2 (e.g., annular shape) is provided to be arranged in line with and to extend along the periphery of a substrate 3. The piece 2 forms a gap 4 together with an edge of the substrate 3. Through the gap 4, immersion liquid will enter extraction duct 5, via vertical channels 6 depicted in FIG. 2B, provided at a regular spacing distance along the entire peripheral length of the extraction duct 5.

The extraction duct 5 is connected to an exit channel system 7, schematically illustrated in FIG. 2C. By providing a powerful gas flow 8, splashing or contamination by immersion liquid on or near the substrate 3 may be prevented. However, typically, the gas flow 8 may provide a considerable thermal load ΔQ to the peripheral part 9 of the substrate 3 and substrate table 1, due to a phase transition of the immersion liquid stimulated by the gas flow 8. Furthermore, the exit channel system 7 may break a symmetry of the substrate table 1, where in principle over the entire periphery of the substrate 3 immersion liquid can be entered in the extraction duct 5 (see FIG. 2B). Exiting of the immersion liquid via exit channel system 7 may therefore not be uniform, due to a local presence of an immersion hood (not shown) near a periphery of the substrate 3. Further, the exit channel system 7, in the vertical connection only exits in a limited number of places, typically, one to six positions over the entire periphery. This may amount to local thermal load ΔQ, through the uneven flows present in the extraction duct 5. The indicated local thermal loads may give rise to a local thermal distortion near the periphery of the substrate 3. In order to prevent or reduce this, according to an aspect of the invention, a thermal decoupler in the form of an insulator edge 11 is arranged at the peripheral part 9 of the substrate table 1.

Accordingly, peripheral thermal loads ΔQ are kept local to the peripheral part 9 and are limited in affecting a central part 12 of the substrate table 1. In addition to the insulating piece 11, other isolating pieces may be present at a different radial distance measured from a center of the substrate table 1, such as is shown in FIG. 2A. Here a first insulator edge 11 is shown that thermally separates the gap 4 from the central part 12. A second insulator edge 13 (e.g., an annulus) is shown further towards the center of the table and covered by a substrate support layer 14. The second edge 13 follows a peripheral duct 15 which may be provided in the peripheral part 9 of the substrate table 1. This will be further described with reference to FIGS. 3 to 5. An edge heater 16 may be present, for example, formed by electric wiring to provide thermal energy to the peripheral part 9 of the substrate table 1. Desirably, the insulator 11 and/or 13 is/are formed from a glass-like material, air, vacuum, a foam glass and/or a polymer. In an embodiment, alternatively or in addition, the insulator is formed of a material having a relatively low stiffness, to mechanically isolate the peripheral part 9 from the central part 12. This may further enhance the mechanical stability of the central part 12 of the substrate table 1 since mechanical deformations of the peripheral part 9 are substantially prevented from being transferred to the central part 12 of the substrate table 1 and thus better imaging quality may be achieved when the substrate 3 is processed in a lithographic process.

In an embodiment (FIG. 3 in conjunction with FIG. 2A), thermal conditioning is provided by circulating a thermal buffering liquid (typically water with one or more possible additives) through a plurality of central ducts 17. More generally the thermal buffering liquid functions as a liquid medium and may be a fluid medium. The plurality of central ducts 17 run through the substrate table 1, typically in a pattern as shown, however, other patterns may be possible. The peripheral part 9 is thermally conditioned through a peripheral duct 15. The liquid in the ducts 15, 17 can be heated by a thermal energy controller 18, which may provide heat to the liquid as a function of a measured input and output temperature. In an embodiment, this thermal energy controller may function as a cooler, to extract heat from the liquid, depending on necessity, especially when controlled actively. To this end, a thermal sensor arrangement, in this embodiment comprising input temperature sensor 19 and an output temperature sensor 20, is provided in a flow path of the liquid. Typically, the liquid circulates through the entire substrate table 1, including central 12 and peripheral parts 9. Therefore, the sensors 19 and 20 control the total amount of energy to be input in the liquid, which is carried out by thermal energy controller 18. To further condition the edge part 9, additionally, an edge heater 16 may be provided, as also described with reference to FIG. 2. The edge heater 16 is typically controlled in response to edge temperature sensors 21, 21', 21" which are mounted in the edge part 9 at predetermined locations in the substrate table edge part 9.

The embodiment in FIG. 3 may have a problem in determining a correct amount of heat to be supplied to the peripheral part 9 since the edge temperature sensors 21, 21', 21" are directly mounted on the substrate table 1. Accordingly, local phenomena giving rise to thermal effects, such as a presence of a droplet in the vicinity of the temperature sensor may significantly influence a temperature value measured by one or more of the sensors. Accordingly, it may be difficult to provide a correct amount of heat with the edge heater 16 which is designed as an edge thermal balancer globally around the periphery of the substrate table 1. Further, the measured temperature of the liquid, measured by the input and output temperature sensors 19, 20, may be significantly influenced by thermal effects at the edge of the table 9. It may therefore be difficult to distinguish edge effects and effects in the central part 12 of the substrate table 1.

According to an embodiment (FIG. 4) of the invention, a thermal sensor arrangement is provided in or near the peripheral duct 15 for calculating the amount of energy to be applied by the thermal energy controller 18. The thermal sensor arrangement comprises desirably at least two temperature sensors distanced from each other at predetermined locations. In the illustrated embodiment, the predetermined locations are located near an input 22 and an output 23 of the duct 15. In an embodiment, a temperature control can be provided by connecting the duct 15 and a central duct 24 that meanders through a central part of the substrate table. In the shown embodiment the central duct 24 is in thermal connection with the thermal energy controller 18 to supply temperature control to the central duct 24. A supply system and reception system are not shown but implicitly present.

In this embodiment (FIG. 4), thermal control can be carried out with three sensors 19, 20 and 25, provided in a single duct 24 that is directed to the central part 12, and which is connected to the peripheral duct 15. In this embodiment a liquid medium is used as fluid medium, but a gas may be applied as well as a medium. In this duct, the overall input temperature can be measured by an input temperature sensor 19 and the output temperature can be measured by output temperature sensor 20. In this way, the overall thermal energy to be applied to the liquid medium can be controlled by thermal energy controller 18 (being, for example, a supply heater and/or cooler), based on temperature signals from the input sensor 19 and the output sensor 20, to stabilize the central part 12 of the substrate table 1. The temperature of the liquid medium when input into the duct 15 can be measured by a single edge temperature sensor 25. In an example, the mean temperature of the liquid medium (e.g., water) can be kept at a fixed mean temperature of, for example, 22° C., that is, $\frac{1}{2}(T_{liquid,in} + T_{liquid,out})$. This minimizes changes in scaling for varying loads to the core of the substrate table due to, for example, different exposure recipes (immersion hood load variations).

With the edge temperature sensor 25 provided in or near the input of the duct 15, the edge heater 16 can be controlled by temperature signals from the edge temperature sensor 25 and the output temperature sensor 20. Desirably, the temperature differences in the edge are kept minimal, therefore, the control goal will preferably be in such a way that $(T_{liquid,out} = T_{liquid,edge})$ to compensate global edge loads.

In an embodiment, a control unit is configured to control the fluid medium temperature such that the central part of the substrate support has a first temperature and the peripheral part has a second temperature. In this embodiment, in an outward direction, two different temperature gradients are expected in the substrate support 1. The outward direction corresponds to going from the middle of the central part of the substrate support to the peripheral part of the substrate support. In this embodiment the temperature is expected to rise in the outward direction in the central part and to fall in the outward direction in the peripheral part. Where the central part and the peripheral part are connected, the temperatures are intended to be equal to reduce or minimize heat transport. However the mean temperature of the central part differs from the mean temperature of the peripheral part as the central part and peripheral part are exposed to different heat loads due to the lithographic processing.

In the embodiment, the central part is subjected to an output heat load by a central heat load generator, e.g. the central duct 24. The peripheral part is subjected to an output head load by a peripheral head load generator, e.g. edge heater 16. This provides the option to provide high level control to the heat transport between the central part and the peripheral part of the substrate support to decrease the requirements for the thermally insulating edges 11,13.

The embodiment encompasses the situation wherein the fluid medium from the central duct 24 supplies the peripheral duct 15. The embodiment also encompasses the situation wherein the heat loads by the fluid medium and the edge heater are determined by expected minimum and maximum lithographic processing heat loads or by measurements at different positions in the substrate support.

Figure 4:
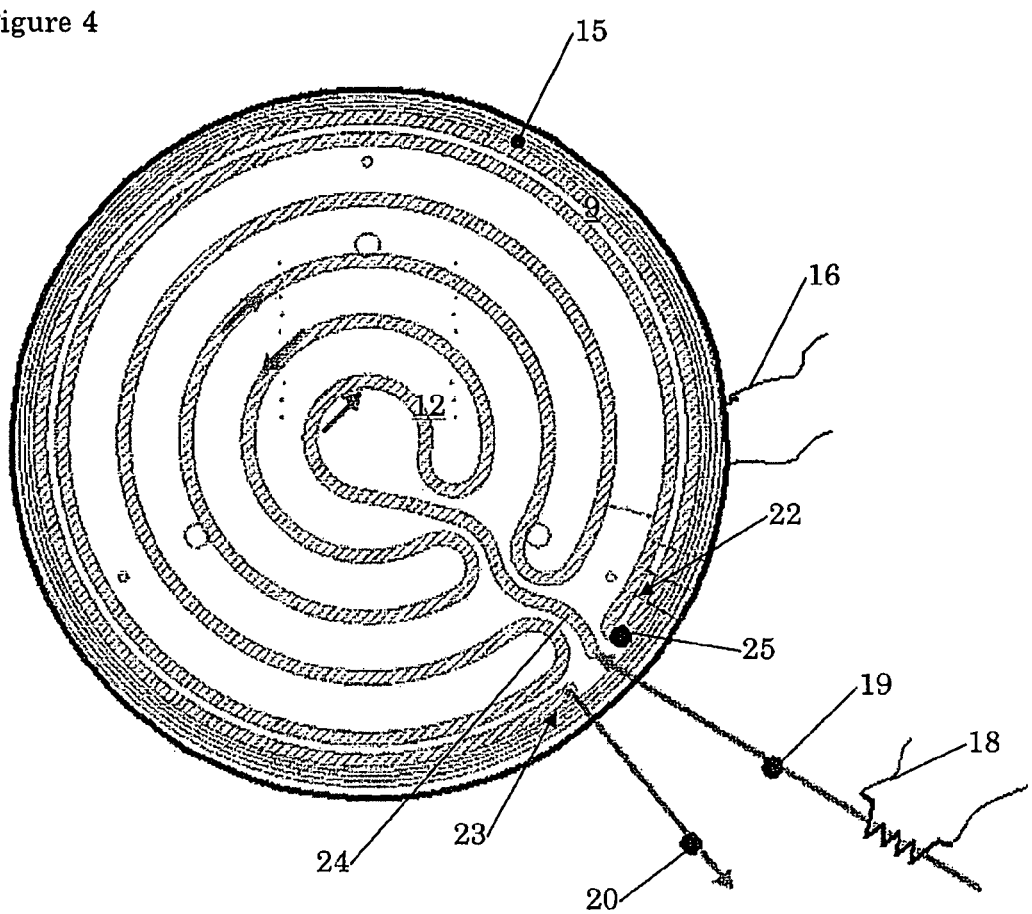
FIG. 4 depicts a portion of a substrate table, in plan, according to an embodiment.

Although FIG. 4 shows a sensor arrangement with only a single edge sensor 25, multiple sensors may be provided in the duct 15, in particular, to cope with asymmetric loads of the immersion hood when locally present near an edge of the substrate table. Typically, local heating may also be provided in such cases. As with the embodiment of FIG. 2A, this embodiment provides an advantage of increased control. This is because the applied heat and thermal effects will be bounded to the peripheral part 9 due to insulator 11 and therefore more accurately measurable by the temperature sensors 19, 20, and 25. Accordingly a more sensitive temperature control system may be provided. This is also true for the embodiment depicted in FIG. 3. In addition, although FIG. 4 shows a substrate table wherein the central duct and the peripheral duct form a single connected duct, multiple parallel ducts may also or alternatively be provided, wherein a branch would be arranged to provide temperature balancing to an edge part 9 and another branch would be arranged to provide temperature balancing to a central part 12.

Furthermore, conventionally, a liquid is conditioned to a preset supply temperature equal to a set temperature of the substrate support 1, in particular to about 22° C. (=the optimal system temperature, based on desired projection system temperature). Accordingly, the temperature set point of the supply medium is conventionally not based on expected heat load towards the liquid. As a result, the temperature of the return liquid is likely to be higher than the optimal system temperature. In addition, the average tool temperature and average component temperature may vary with different modes of operation of the lithographic system. Both effects may result in machine performance loss. According to an aspect of the invention, the fluid medium supply temperature is at a temperature lower than a set temperature, in such a manner that the average fluid medium temperature (supply vs. return) will be the set temperature, in particular, of about 22° C. In this way, the effect of the heat input from (a) fluid lines and/or (b) components may be reduced or minimized. According to an aspect, two ways of implementing this principle are foreseen: 1) a fixed fluid medium supply temperature having a set point temperature, based on, e.g., a maximum heat load towards (part of) the fluid medium system so that the average temperature of supply and return fluid medium will be closer to the set point of 22° C.; and/or 2) the fluid medium supply temperature is controlled actively. In this way, variations due to varying power consumption/heat load can be dealt with.

These aspects may be combined in the embodiment depicted in FIG. 4, by reversing the flow of the fluid medium as depicted, so that the fluid medium supply temperature is controlled by thermal energy controller 18 (which may have a heating and/or cooling function) to a temperature that is actively controlled by controller 18 to a preset temperature measured by the edge temperature sensor 25 and controlled to a preset temperature below the set temperature of the central part 12, to comply with an expected or measured heat load of the substrate support 1.

Figure 5:
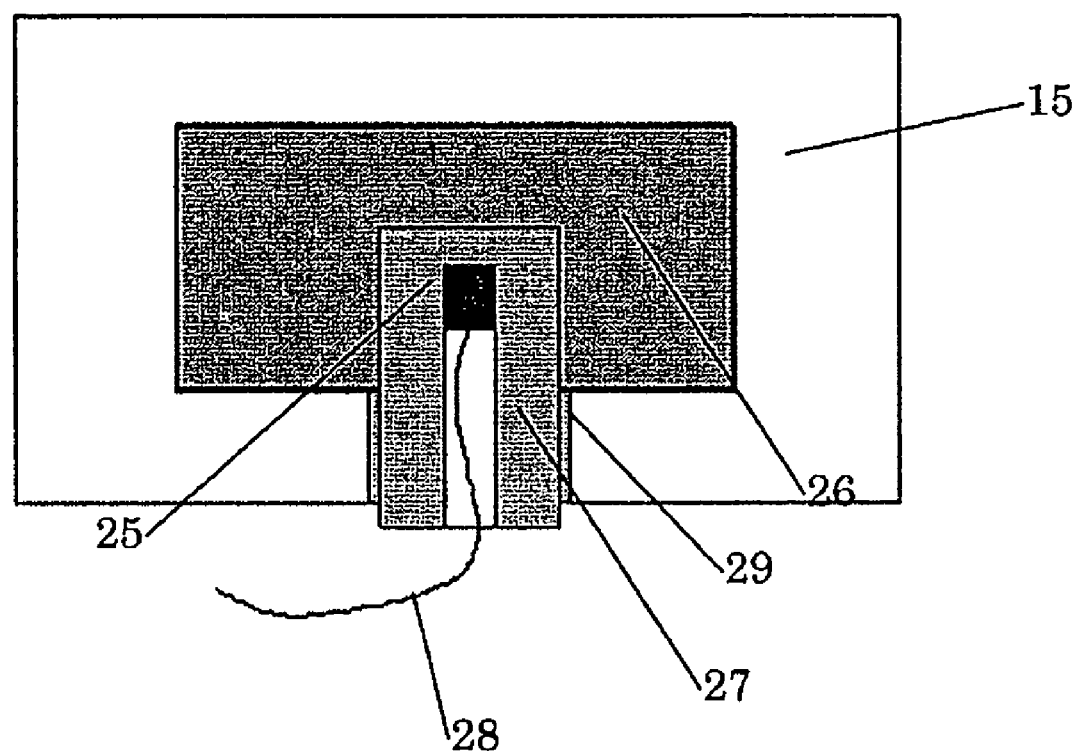
FIG. 5 illustrates a duct configuration for a substrate table according to an embodiment.

FIG. 5 schematically shows an embodiment of duct 15 provided with a temperature sensor 25. Typically, the duct 15 is provided with conductive walls to be able to transport heat into the fluid medium 26. The sensor 25 is desirably enclosed in a thermally conductive seal 27, which protects the sensor 25 and wiring 28 from the liquid 26. Also, desirably, the lower sides of the sensor 25 not in thermal contact with the fluid medium are thermally isolated by isolating material 29.

Although the illustrated embodiments refer to a substrate support to be used to hold a substrate to be targeted with a patterned beam, the structure may be very well applied to a patterning device support structure or any other support that needs thermal stabilization.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In an embodiment for imprint lithography, topography present on a patterning device is pressed into a layer of resist supplied to the substrate whereupon the resist is cured by applying, for example, heat. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

An embodiment of the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A substrate support, comprising:
   a central part;
   a peripheral part positioned around the central part; and
   a thermal decoupler disposed within the substrate support arranged to decrease heat transport between the central part and the peripheral part,
   wherein the peripheral part comprises an extractor arranged to extract a liquid from a top surface of the substrate support, and
   wherein the thermal decoupler comprises an isolator arranged centrally relative to the extractor to at least one of thermally and mechanically isolate the peripheral part from the central part.

2. The substrate support of claim 1, wherein the isolator comprises at least one of a glass-like material, air, vacuum, a foam glass, and a polymer.

3. The substrate support of claim 1, further comprising:
   a peripheral duct arranged to duct a fluid medium through the peripheral part and connected to a supply system arranged to control the temperature of the fluid medium.

4. The substrate support of claim 3, wherein the supply system is arranged to control the temperature of the fluid medium to a temperature which differs from a desired temperature of the peripheral part of substrate support.

5. The substrate support of claim 4, wherein the supply system is arranged to control the temperature of the fluid medium at a fixed difference with respect to a desired temperature of the substrate support.

6. The substrate support of claim 4, wherein the supply system is arranged to control the temperature of the fluid medium based on a desired temperature of the substrate support and an expected heat load to the substrate support.

7. The substrate support of claim 3, further comprising:
   an edge temperature sensor arranged to measure a temperature of the fluid medium at an input of the peripheral duct;
   an output temperature sensor arranged to measure a temperature of the fluid medium at an output of the peripheral duct;
   an edge heater arranged to heat the peripheral part; and a controller connected to the edge temperature sensor and the output temperature sensor, the controller being arranged to control the amount of heat output by the edge heater based on the difference between the measured temperature of the fluid medium at the input of the peripheral duct and at the output of the peripheral duct.

8. The substrate support of claim 7, wherein the controller is arranged to control the temperature of the fluid medium based on the measured temperature of the fluid medium at the input of the peripheral duct and the measured temperature at the output of the peripheral duct.

9. The substrate support of claim 3, wherein the peripheral duct is supplied with the fluid medium via a central duct that meanders through the central part.

10. The substrate support of claim 1, further comprising:

a central heat load generator in the central part configured to generate a central heat load output; and a peripheral heat load generator in the peripheral part configured to generate a peripheral heat load output, wherein the central and the peripheral heat load generators are controlled by a control unit arranged to control the central heat load output and the peripheral heat load output individually.

11. A lithographic apparatus, comprising:

a substrate support to support a substrate during immersion lithographic processing, the substrate support comprising:

a central part, a peripheral part positioned around the central part, and a thermal decoupler arranged to decrease heat transport between the central part and the peripheral part, wherein the peripheral part comprises an extractor arranged to extract an immersion fluid from a top surface of the substrate support; and a projection system configured to project a patterned radiation beam onto a target portion of the substrate, wherein the apparatus is arranged to provide the immersion fluid between the substrate support and the projection system, and wherein the thermal decoupler comprises an isolator arranged centrally relative to the extractor to at least one of thermally and mechanically isolate the peripheral part from the central part.

12. The lithographic apparatus of claim 11, wherein the extractor comprises an annular extraction duct.

13. The lithographic apparatus of claim 11, further comprising:

a peripheral duct arranged to duct a fluid medium through the peripheral part and connected to a supply system arranged to control the temperature of the fluid medium.

14. The lithographic apparatus of claim 11, further comprising:

a central heat load generator in the central part configured to generate a central heat load output; and a peripheral heat load generator in the peripheral part configured to generate a peripheral heat load output, wherein the central and the peripheral heat load generators are controlled by a control unit arranged to control the central heat load output and the peripheral heat load output individually.

15. A lithographic process, comprising:

predicting a heat load to be experienced by a substrate support configured to support a substrate;

supplying a fluid to a central part and a peripheral part of the substrate support, wherein the peripheral part is positioned around the central part;

ducting the fluid through a duct of the substrate support;

decreasing heat transport between the central part and the peripheral part using a thermal decoupler disposed within the substrate support, wherein the peripheral part comprises an extractor arranged to extract a liquid from a top surface of the substrate support, and wherein the thermal decoupler comprises an isolator arranged centrally relative to the extractor to at least one of thermally and mechanically isolate the peripheral part from the central part;

estimating a temperature change to the fluid between supplying the fluid to the substrate support and the fluid being ducted along a control position in the duct, based on the predicted heat load to the substrate support; and controlling the fluid to have a desired temperature at the control position by giving the fluid an offset to the desired temperature before supplying it to the substrate support, the offset corresponding to the estimated temperature change.

16. The lithographic process of claim 15, wherein the heat load is caused by illuminating the substrate supported by the substrate support with a patterned beam of radiation.

17. The lithographic process of claim 15, wherein the offset is fixed during the process.

18. The lithographic process of claim 15, wherein the estimated temperature change is based on temperature measurements of the substrate support.

* * * * *